United States Patent [19]
Grondalski

[11] Patent Number: 5,070,256
[45] Date of Patent: Dec. 3, 1991

[54] BUS TRANSMITTER HAVING CONTROLLED TRAPEZOIDAL SLEW RATE

[75] Inventor: David S. Grondalski, Cambridge, Mass.

[73] Assignee: Digital Equipment Corporation, Maynard, Mass.

[21] Appl. No.: 403,900

[22] Filed: Sep. 1, 1989

Related U.S. Application Data

[63] Continuation of Ser. No. 219,841, Jul. 8, 1988, abandoned, which is a continuation of Ser. No. 67,945, Jun. 29, 1987, abandoned.

[51] Int. Cl.$^5$ ............... H03K 3/01; H03K 17/687; H03K 19/094
[52] U.S. Cl. ................... 307/270; 307/571; 307/585; 307/451; 307/443
[58] Field of Search ............ 307/270, 263, 451, 443, 307/571, 574, 576, 577, 579, 583, 585

[56] References Cited

U.S. PATENT DOCUMENTS

| | | | |
|---|---|---|---|
| 3,772,533 | 11/1973 | Bruckner et al. | 307/263 |
| 4,216,393 | 8/1980 | Gillberg et al. | 307/263 |
| 4,320,521 | 3/1982 | Balakrishnan et al. | 307/263 |
| 4,424,456 | 1/1984 | Shiraki et al. | 307/451 |
| 4,498,021 | 2/1985 | Uya | 307/263 |
| 4,504,779 | 3/1985 | Haman | 307/270 |
| 4,504,959 | 3/1985 | Heckenbach | 307/475 |
| 4,567,378 | 1/1986 | Raver | 307/263 |
| 4,578,600 | 3/1986 | Magee | 307/451 |
| 4,593,206 | 6/1986 | Neidorff et al. | 307/270 |
| 4,596,936 | 6/1986 | Aoyama | 307/263 |
| 4,615,039 | 9/1986 | Li et al. | 375/36 |
| 4,622,482 | 11/1986 | Ganger | 307/263 |
| 4,763,023 | 8/1988 | Spence | 307/451 |

FOREIGN PATENT DOCUMENTS

| | | | |
|---|---|---|---|
| 0083504 | 12/1982 | European Pat. Off. | |
| 0143699 | 6/1985 | European Pat. Off. | |
| 0199374 | 10/1986 | European Pat. Off. | 307/451 |

OTHER PUBLICATIONS

Patent Abstracts of Japan, vol. 9, No. 69, 29 Mar. 1985; & JP A-59 207723 (Hitachi Seisakusho KK), 24.11.1984.
Patent Abstracts of Japan, vol. 11, No. 83, 13 Mar. 1987; & JP A 61 237513 (Mitsubishi Electric Corp.), 22.10.1986.

Primary Examiner—Stanley D. Miller
Assistant Examiner—Trong Phan
Attorney, Agent, or Firm—Fish & Richardson

[57] ABSTRACT

A transmitter circuit for transmitting a digital data signal over a bus in a digital data processing system includes a MOSFET bus driver transistor having a gate to drain capacitance $C_{GD}$ which substantially dominates other capacitances at the gate terminal. The bus driver transistor is driven by a buffer circuit having pull-up and pull-down transistors current through which is controlled by current sources. The gate terminal of the driver transistor is connected to, and controlled by, the node between the pull-up and pull-down transistors. The drain terminal of the driver transistor is connected to, and controls, a bus line. To assert a signal on the bus line, the pull-up transistor is turned on to drive current into the node at a rate governed by the current source, which increases the voltage level of the node. When the voltage level of the node reaches the driver transistor's threshold level, the driver transistor begins to turn on, allowing the voltage level of the bus line to drop. Contemporaneously, current flows into the node from the bus line through the driver transistor's high gate to drain capacitance, thereby limiting the voltage level of the node, and thus the current flow through the driver transistor. Thus, current flows through the driver transistor from the bus line in a manner controlled, in part, by the voltage level on the bus line. In negating a signal on the bus line, the operations are similar, with current flowing out of the node through the pull-down transistor and the driver transistor's gate to drain capacitance.

11 Claims, 1 Drawing Sheet

BUS TRANSMITTER HAVING CONTROLLED TRAPEZOIDAL SLEW RATE

This is a continuation of copending application(s) Ser. No. 07/219,841 filed on July 8, 1988, now abandoned, which is a continuation of application Ser. No. 07/067,945 filed on June 29, 1987, now abandoned.

BACKGROUND OF THE INVENTION

1. Field of the Invention

The invention relates generally to the field of electronic circuits, and more specifically to circuits for transmitting signals over buses in digital data processing systems.

2. Description of the Prior Art

A digital data processing system includes a number of functional units, including one or more processors, memories, and input/output devices such as mass storage devices, video display terminals, printers and telecommunications devices, all interconnected by one or more buses. The buses carry signals representing information among the various units comprising the system, as well as control signals which, inter alia, control the transfer of the information signals.

Generally, a bus is a set of wires to which several functional units may connect in parallel. When a unit transmits a signal over a wire in a bus, the signal may be reflected when it reaches an end of the bus. Reflected signals may interfere with signals that are later transmitted over the bus wire, which may cause signaling errors over the bus. A major problem with signal reflections is that they can corrupt later transmitted signals. Accordingly, a system designer may have to provide a sufficient delay time following a transmission before another transmission can take place to minimize likely interference from signal reflections.

Alternatively, the system designer may be able to configure the bus or the signals transmitted thereover to minimize reflections. For example, the wires of some include resistor networks at each end which assist in reducing reflections. Power for the bus can also be provided through these bus terminator networks.

In addition, the shape of the signal waveform may be adjusted so as to minimize reflections and crosstalk between signals on different bus lines. In particular, a signal's waveform may be relatively square, in which the voltage level of the bus wire changes relatively abruptly between a high and a low voltage level. Such a signal waveform permits fast signaling, but it also is most likely to cause signal reflections and crosstalk.

On the other hand, if the signals are "trapezoidal" in which voltage levels of the signals change between the high and low levels at a less abrupt, but still rapid, rate, the likelihood of reflections can be minimized. The transmitters which produce such signals must be able to control the rate of change of the voltage on the wires, that is, the "slew rate", within selected limits. This problem is compounded since, in most systems, the buses must be able to handle widely varying numbers of units connected thereto, which, in turn, results in widely varying capacitive load conditions which can vary the slew rate of the signals transmitted over the bus wires.

Currently, transmitters capable of producing trapezoidal signal waveforms are implemented using bipolar transistor devices in combination with discrete resistors and other components whose electrical values can be controlled to a high level of accuracy. Most of the circuits comprising the functional units of digital data processing systems are implemented using MOSFET (metal-oxide-semiconductor field effect transistor) devices, and the bipolar transmitter circuits are implemented separate and apart from the other components comprising the units, which take up a considerable amount of space on the printed circuit boards on which the circuit elements comprising the units are mounted. In addition, the bipolar transmitters, because they are discrete, bipolar and separate from the other devices, require large amounts of electrical power and provide extra delay in the transmitted signal.

SUMMARY OF THE INVENTION

The invention provides a new and improved transmitter circuit implemented using MOSFET devices for producing signals with trapezoidal waveforms for transmission over a bus.

In brief summary, the new bus transmitter circuit includes a MOSFET bus driver transistor driven by a buffer circuit having pull-up and pull-down transistors current through which is controlled by constant current sources. The gate to drain capacitance $C_{GD}$ of the driver transistor is substantially higher than other capacitances at the gate terminal. The gate terminal of the driver transistor is connected to, and controlled by, the node between the pull-up and pull-down transistors. The drain terminal of the driver transistor is connected to, and controls, a bus line. To assert a signal on the bus line, the pull-up transistor is turned on to drive current into the node at a rate governed by the current source, which increases the voltage level of the node. When the voltage level of the node reaches the driver transistor's threshold level, the driver transistor begins to turn on, allowing the voltage level of the bus line to drop. Contemporaneously, current begins to flow into the node from the bus line through the driver transistor's gate to drain capacitance, thereby limiting the voltage level of the node, and thus the current flow through the driver transistor. Thus, current flows through the driver transistor from the bus line in a manner controlled, in part, by the rate of change of the voltage level on the bus line, thereby accomplishing the trapezoidal slew in the signal on the bus line. In negating a signal on the bus line, the operations are similar, with current flowing out of the node through the pull-down transistor and the driver transistor's gate to drain capacitance.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
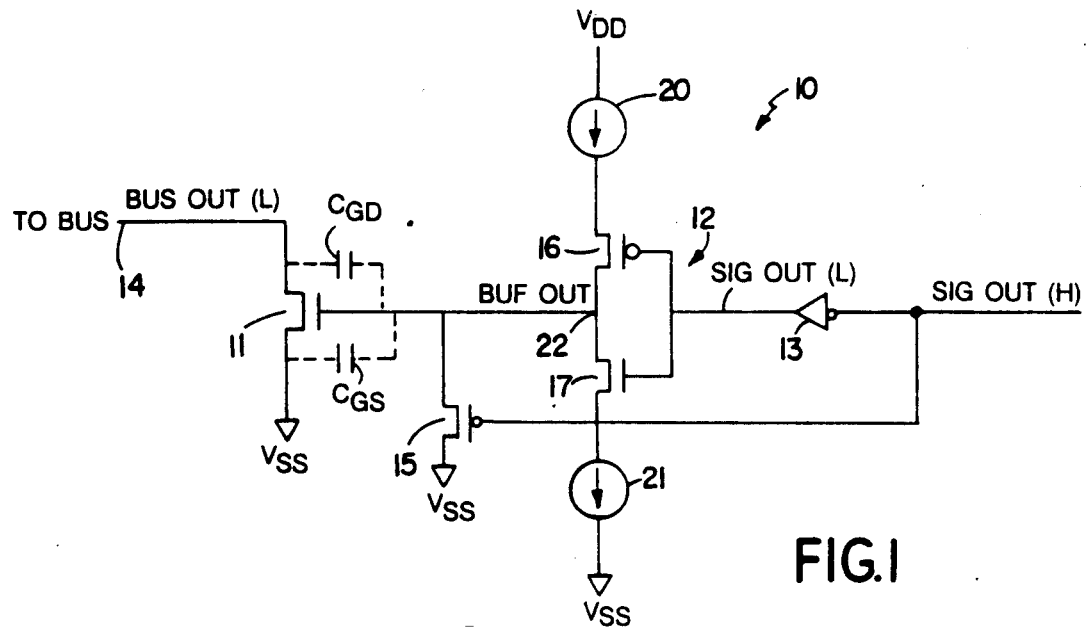
FIG. 1 is a schematic circuit diagram of a digital data bus transmitter constructed in accordance with the invention.

With reference to FIG. 1, a transmitter 10 constructed in accordance with the invention includes a bus driver transistor 11 whose gate terminal receives an BUF OUT buffer out digital data signal from a buffer circuit 12 in the form of an inverter. In response to an asserted (that is, high) BUF OUT buffer out signal from buffer circuit 12, the bus driver transistor turns on to transmit a BUS OUT (L) bus out (asserted low) digital data signal over a bus line 14. The bus driver transistor 11 has a drain terminal which is connected directly to the bus line 14, and a source terminal which is connected to a $V_{SS}$ power supply, which is effectively at the ground voltage level. The bus driver transistor 11 is an n-type metal-oxide-semiconductor field effect transistor (MOSFET).

The buffer circuit 12, in turn, includes a p-type pull-up transistor 16 and an n-type pull-down transistor 17 connected between two constant current sources 20 and 21. Current source 20 is connected to a $V_{DD}$ power supply and controls the current which is coupled to the drain terminal of pull-up transistor 16. The source terminal of pull-up transistor 16, in turn, is connected to a node 22, to which the drain terminal of pull-down transistor 17 is also connected. The source terminal of the pull down transistor 17, in turn, is connected to a current source 21, which controls the current which flows therethrough from the node 22 to the $V_{SS}$ power supply. The BUF OUT inverter output signal, which is coupled to the gate terminal of bus driver transistor 11, is provided at the node 22 between the source terminal of the pull-up transistor 16 and the drain terminal of the pull-down transistor 17. Returning to transistor 11, that transistor has a high capacitance between its gate and drain terminals (shown as $C_{GD}$ in FIG. 1) in comparison to other capacitances at node 22, so that the gate to drain capacitance $C_{GD}$ substantially dominates other sources of capacitance on node 22.

The gate terminals of the pull-up transistor 16 and the pull-down transistor 17 are controlled in tandem by a SIG OUT (H) signal output (asserted high) signal from an inverter 13 which, in turn, inverts a SIG OUT (L) signal output (asserted low) signal from other circuitry (not shown). The SIG OUT (L) signal output (asserted low) signal also controls a p-type transistor 15 whose drain terminal is connected to the node 22 and whose source terminal is connected to the $V_{SS}$ power supply.

Initially, the SIG OUT (H) signal output (asserted high) signal is in a low voltage (negated) condition. As a result, transistor 15 is on. Inverter 13 complements the SIG OUT (H) signal output (asserted high) signal to provide a high voltage level (negated) SIG OUT (L) signal output (asserted low) signal, which, in turn, maintains transistor 17 in an on condition and transistor 16 in an off condition. At this point, charge from node 22 has been transferred through current source 21 to the $V_{SS}$ source voltage level (that is, ground), and so the BUF OUT buffer output signal is at a low voltage level. In addition, since driver transistor 11 is off, the BUS OUT (L) bus out (asserted low) signal is at a high voltage level (thereby providing a signal having a negated logic level), as shown at time A (FIG. 2).

When the SIG OUT (H) signal output (asserted high) signal shifts from the negated (low voltage) condition to the asserted (high voltage) condition, the transistor 15 turns off. In addition, the inverter 13 complements the SIG OUT (H) signal output (asserted high) signal to form a SIG OUT (L) signal output (asserted low) signal in a low voltage (asserted) condition. As a result, the transistor 17 turns off blocking the current path from node 22 through the current source 21 to the $V_{SS}$ power supply. In addition, the SIG OUT (L) signal output (asserted low) signal turns transistor 16 on, thereby creating a path to node 22 from the $V_{DD}$ power supply through current source 20.

Figure 2:
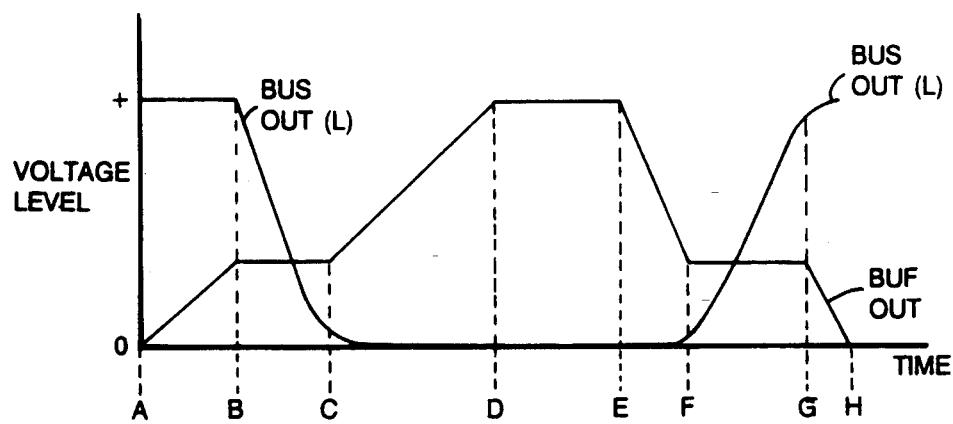
FIG. 2 is a diagram depicting signal waveforms at two points of the circuit depicted in FIG. 1, which is useful in understanding the transmitter depicted in FIG. 1.

Since transistor 16 is on, the voltage level of the BUF OUT buffer output signal begins to rise, as shown from time A to time B in FIG. 2. At time B (FIG. 2) the voltage level of the BUF OUT buffer output signal has risen to the threshold voltage level, and so the bus driver transistor 11 begins to turn on. This, in turn, enables current from bus line 14 to flow through the bus driver transistor 11, causing the voltage level of the BUS OUT (L) bus out (asserted low) signal to drop, as shown immediately after time B (FIG. 2). However, since the $C_{GD}$ gate to drain capacitance of the bus driver transistor 11 is a relatively large proportion of the total capacitance on node 22, current also is injected into node 22 from bus line 14 through the $C_{GD}$ gate to drain capacitance. Thus, the $C_{GD}$ gate to drain capacitance provides a feedback path so that the BUS OUT (L) bus output (asserted low) signal effects the voltage level of node 22.

Since at this point two sources, namely current source 20 (through pull-up transistor 16) and bus line 14 (through the $C_{GD}$ gate to drain capacitance of bus driver transistor 11), are forcing current into node 22 from opposite directions, the voltage level of node 22 with respect to ground (that is, the voltage level of the $V_{SS}$ source power supply), the voltage level of the node 22 does not change, as shown between times B and C in FIG. 2. Accordingly, the voltage level on the gate terminal of the bus driver transistor 11 is maintained at about the threshold level, so that the transistor 11 is maintained on, but at a level at which the voltage level of the bus line 14 falls at a controlled rate. That is, the voltage of the BUS OUT (L) bus out (asserted low) signal changes from a high level to a low level over a time period that is related to the $C_{GD}$ gate to drain capacitance of the bus driver transistor 11 and the current flow provided by current source 20.

As the voltage level of the BUS OUT (L) bus out (asserted low) signal on bus line 14 completes its downward transition, the rate at which current is injected into the node 22 through the $C_{GD}$ gate to drain capacitance from the bus line 14 also drops. As a result, the current injected into node 22 from current source 20 through pull-up transistor 16 dominates node 22, and the voltage level of node 22 again begins increasing, as shown between times C and D (FIG. 2). The rate of increase depends on the capacitance of the node 22, including the $C_{GD}$ gate to drain capacitance, and the current supplied by current source 20. At time D (FIG. 2) the node 22 is charged to the maximum voltage level. At this point, the bus driver transistor 11 is fully on, and node 22 is fully charged, as shown by the high BUF OUT buffer output signal at time D, FIG. 2. Furthermore, by time D, the BUS OUT (L) bus out (asserted low) signal is fully asserted, that is, it is at the low voltage level.

The BUF OUT buffer output signal remains at a high voltage level, and the BUS OUT (L) bus out (asserted low) signal remains at a low voltage level, until time E. At time E, the SIG OUT (H) signal output (asserted high) signal is negated, that is, it is driven to a low voltage level. As a result, the inverter 13 complements the low SIG OUT (H) signal output (asserted high) signal to provide a high SIG OUT (L) signal output (asserted low) signal. The high SIG OUT (L) signal output (asserted low) signal, in turn, turns off pull-up transistor 16, thereby turning off the current path from current source 20 to node 22, and turns on pull-down transistor 17, thereby providing a current path from node 22 to current source 21.

In addition, the high SIG OUT (H) signal output (asserted high) signal turns on transistor 15, which provides a current path directly between node 22 and the ground voltage level provided by the $V_{SS}$ source power supply. The current path through transistor 15 permits the node 22 to be quickly discharged to the threshold voltage level of the transistor 15, between times E and F (FIG. 2). In one specific embodiment, in which the transistor 15 is a p-type transistor, transistor 15 allows the voltage level of the node 22 to drop to about two and a half volts from a five volt fully charged condition. Some current also flows out of node 22 through pull-down transistor 17 and current source 21 during this time, but the primary current path is through transistor 15. After sufficient current has flowed out of node 22 to bring the voltage level of the node 22 to the threshold level of bus driver transistor 11, the bus driver transistor 11 begins to turn off, allowing the voltage level of the BUS OUT (L) bus out (asserted low) signal to rise, to thereby negate the BUS OUT (L) bus out (asserted low) signal.

Around time F, when the voltage difference between the drain terminal of transistor 15 with respect to its gate terminal has fallen to the transistor's threshold level, the transistor 15 essentially turns off. However, current attempts to continue to flow out of node 22 through pull-down transistor 17 and current source 21. Contemporaneously, current continues to flow out of node 22 in the opposite direction, that is, through the gate to drain capacitance $C_{GD}$ of bus driver transistor 11. Since current is drawn from node 22 in opposite directions, the voltage level of the node 22, which provides the BUF OUT buffer output signal, is constant, as shown at times F-G, FIG. 2, at a level sufficient to maintain transistor 11 on at a controlled level. This allows the voltage level of the BUS OUT (L) bus output (asserted low) signal to increase at a steady controlled rate during that time period, as shown in FIG. 2.

At time G, the gate to drain capacitance $C_{GD}$ stops drawing charge from node 22, and so charge leaves node 22 only through transistor 17, which is still on, at a rate controlled by the current source 21. Accordingly, the voltage level of node 21 falls to the $V_{SS}$ source power supply level, which is the ground level for the transmitter circuit 10. Accordingly, the BUF OUT (L) buffer output (asserted low) signal drops at a controlled rate between times G-H (FIG. 2) as shown in FIG. 2.

It will be appreciated that the transistor 15 is provided to reduce the time E-F required to pull the voltage level of node 22 to the point at which bus driver transistor 11 begins to turn off. In the absence of transistor 15, the current instead flow through pull-down transistor 17 and current source 21, but since the current source 21 limits the flow of current, a longer time is required to bring the voltage of node 22 to the point at which the driver transistor 11 starts to turn off.

In addition, it will be recognized that the large gate to drain capacitance $C_{GD}$ essentially provides a feedback path allowing the BUS OUT (L) bus output (asserted low) signal to, in part, control the voltage level on node 22, which, in turn, controls the rise and fall of the signal. This results in a BUS OUT (L) bus output (asserted low) signal having a leading edge (between times B-C, FIG. 2) and a trailing edge (between times F-G, FIG. 2) having suitable rise and fall times, to thereby provide a "trapezoidal" signal. This signal shape reduces he ringing and other noise inherent in signals having very short (that is, rectangular) rise and fall times. This signal shape is accomplished by having a large gate to drain capacitance $C_{GD}$ which substantially dominates the total capacitance at the gate terminal of the driver transistor to facilitate current flow through the gate to drain capacitance $C_{GD}$ during signal transitions of the BUS OUT (L) bus output (asserted low) signal, as described above.

The foregoing description has been limited to a specific embodiment of this invention. It will be apparent, however, that variations and modifications may be made to the invention, with the attainment or some or all of the advantages of the invention. Therefore, it is the object of the appended claims to cover all such variations and modifications as come within the true spirit and scope of the invention.

What is claimed as new and desired to be secured by Letters Patent of the United States is:

1. A bus transmitter circuit comprising:
   A. a driver including a MOSFET driver transistor having a drain terminal for connection to a bus line, a gate terminal connected to a control node and a source terminal for connection to a source power supply, said MOSFET driver transistor having a relatively high inherent capacitance between its drain terminal and its gate terminal which substantially dominates other capacitances at said gate terminal to thereby provide an internal feedback path between said drain terminal and said control node; and
   B. a control buffer including a switched pull-up comprising a pull-up transistor and a pull-up current source, and a switched pull-down comprising a pull-down transistor and a pull-down current source, said pull-up transistor and said pull-down transistor being connected to said control node, said switched pull-up transistor and said switched pull-down transistor being further connected to receive a data input signal to control the control node of said driver in response to the condition of said data input signal, current through said pull-up transistor and said pull-down transistor to said control node being controlled by the respective current source to turn said driver on and off in a controlled manner,
   said internal feedback path providing a bidirectional path through said inherent capacitance for current flow between said control node and said bus to selectively control the voltage level of a signal at said control node and thereby control the rate at which said driver turns on and off in response to said data input signal.

2. A bus transmitter circuit as defined in claim 1 further comprising a driver pull-down transistor connected to the control node and controlled by a pull-down control signal complementary to the data input signal to condition the control node to a selected level when the data input signal shifts levels to thereby facilitate a rapid turn-off of the driver transistor.

3. A bus transmitter circuit as defined in claim 1 wherein said pull-up transistor and said pull-down transistor are of different conductivity types.

4. A bus transmitter circuit as defined in claim 2 further comprising an inverter for receiving said pull-down control signal and producing said data input signal as the complement of said pull-down control signal.

5. A bus transmitter circuit comprising:
A. a driver including a MOSFET driver transistor having a drain terminal for connection to a bus line, a gate terminal connected to a control node and a source terminal for connection to a source power supply, said MOSFET driver transistor having a relatively high inherent capacitance between its drain terminal and its gate terminal which substantially dominates other capacitances at said gate terminal to thereby provide an internal feedback path between said drain terminal and said control node;
B. a control buffer including:
  i. a switched pull-up comprising:
    a. a pull-up current source for supplying current at a controlled rate;
    b. a pull-up transistor of a selected conductivity type having a drain terminal connected to said pull-up current source, a source terminal connected to said control node, and a gate terminal;
  ii. a switched pull-down comprising:
    a. a pull-down current source for supplying current at a controlled rate;
    b. a pull-down transistor of a different conductivity type than said pull-up transistor, said pull-down transistor having a drain terminal connected to said control node, a source terminal connected to said pull-down current source, and a gate terminal;
  the gate terminals of both said pull-up transistor and said pull-down transistor being connected to receive said data input signal, current through said pull-up transistor to said control node being controlled by said pull-up current source and through said pull-down transistor to said control node being controlled by the pull-down current source to turn said driver on and off in a controlled manner, said feedback path providing a bidirectional path through said inherent capacitance for current flow between said control node and said bus to selectively control the voltage level of a signal at said control node and thereby control the rate at which said driver turns on and off in response to said data input signal; and
  c. a driver pull-down transistor having a drain terminal connected to the control node and a gate terminal controlled by a pull-down control signal complementary to said data input signal to condition the control node to a selected level when the data input signal shifts levels to thereby facilitate a rapid turn-off of the driver transistor.

6. A bus transmitter circuit as defined in claim 5 further comprising an inverter for receiving said pull-down control signal and producing said data input signal as the complement of said pull-down control signal.

7. A bus transmitter circuit comprising
a driver transistor having an output terminal for connection to a bus line, a reference terminal coupled to a power supply, and an input terminal coupled to a control node,
a buffer for controlling the control node of said driver in response to the condition of a data signal received by said buffer to turn said driver transistor on and off in a controlled manner, and
an inherent capacitance disposed between said input terminal and said output terminal that is relatively high compared to other capacitances at said input terminal to provide an internal feedback path between said output terminal and said control node for the bidirectional flow of current between said control node and said bus to selectively control the voltage level of a signal at said control node and thereby control the rate at which said driver transistor turns on an doff in response to said data signal.

8. The bus transmitter circuit of claim 7 wherein said capacitance is an inherent capacitance of said driver transistor between said input terminal and said output terminal that substantially dominates other capacitances of said driver transistor at said input terminal.

9. The bus transmitter circuit of claim 8 wherein said driver transistor is a field effect transistor and said input terminal is the gate terminal of said field effect transistor.

10. The bus transmitter circuit of claim 7 wherein said buffer comprises current source circuitry for controlling current at said control node to turn said driver transistor on and off in a controlled manner.

11. The bus transmitter circuit of claim 7 further comprising a driver pull-down transistor having an output terminal connected to said control node and an input terminal controlled by a pull-down control signal complementary to said data signal to condition the control node to a selected level when the data signal shifts levels to thereby facilitate rapid turn-off of said driver transistor.

* * * * *

UNITED STATES PATENT AND TRADEMARK OFFICE
CERTIFICATE OF CORRECTION

PATENT NO.   : 5,070,256
DATED        : December 3, 1991
INVENTOR(S)  : Grondalski It is certified that error appears in the above-identified patent and that said Letters Patent is hereby corrected as shown below:

Title page, item [56], under the heading "OTHER PUBLICATIONS", please add the following two references:

E. Holzler et al., Pulstechnik, "Band II Anwendungen und Systeme", Springer Verlag, Berlin Heidelberg, New York, 1976.

Siemens, Dititale Schaltungen, MOS Datenbuch 1974/75 Band 1, pp. 372-404.

Col. 8, line 28; "an doff" should be --and off--.

Signed and Sealed this

Twenty-first Day of September, 1993

Attest:

BRUCE LEHMAN

*Attesting Officer*    *Commissioner of Patents and Trademarks*